United States Patent [19]

Agnello et al.

[11] Patent Number: 5,227,330
[45] Date of Patent: Jul. 13, 1993

[54] COMPREHENSIVE PROCESS FOR LOW TEMPERATURE SI EPITAXIAL GROWTH

[75] Inventors: Paul D. Agnello, Hopewell Junction; Tung-Sheng Kuan, Chappaqua; Thomas O. Sedgwick, Croton-on-Hudson, all of N.Y.

[73] Assignee: International Business Machines Corporation, Armonk, N.Y.

[21] Appl. No.: 785,731

[22] Filed: Oct. 31, 1991

[51] Int. Cl.$^5$ .................. H01L 21/20; H01L 21/203
[52] U.S. Cl. ..................................... 437/108; 437/89; 437/106; 156/610
[58] Field of Search .................. 437/106, 108, 89, 90

[56] References Cited

FOREIGN PATENT DOCUMENTS 022412  1/1991  Japan .

OTHER PUBLICATIONS

J. Crys. Growth 73(1), 21–30 (1985); "A mechanism and Kinetics of silicon growth" by Elias et al.

Primary Examiner—Olik Chaudhuri
Assistant Examiner—Ramamohan Paladugu
Attorney, Agent, or Firm—Thomas P. Dowd

[57] ABSTRACT

A system and method for growing low defect density epitaxial layers of Si on imperfectly cleaned Si surfaces by either selective or blanket deposition at low temperatures using the APCVD process wherein a first thin, e.g., 10 nm, layer of Si is grown on the surface from silane or disilane, followed by the growing of the remainder of the film from dichlorosilane (DCS) at the same low temperature, e.g., 550° C. to 850° C. The subsequent growth of the second layer with DCS over the first layer, especially if carried out immediately in the very same deposition system, will not introduce additional defects and may be coupled with high and controlled n-type doping which is not available in a silane-based system. Further, in order to achieve an optimal trade-off between the need for an inert ambience to promote silane reaction at low temperature and the need for a hydrogen ambience to prevent surface oxidation from inadvertant residual impurities, depositions are carried out in an ambience composed primarily of He but always containing some $H_2$. Alternatively, instead of using He for $H_2$ as the primary carrier gas when depositing Si from silane at low temperatures, DCS with a diborane additive may be used instead of silane in the normal hydrogen carrier. This modification permits DCS to be used in atmospheric pressure processes for Si deposition at low temperatures, which conventionally deposit Si selectively, to deposit blanket (non-selective) Si films over insulator and Si areas, and particularly such areas on a patterned wafer. Because the Si deposition rate is enhanced when diborane is added, significant non-selective deposition rates can occur down to 550° C.

14 Claims, No Drawings

COMPREHENSIVE PROCESS FOR LOW TEMPERATURE SI EPITAXIAL GROWTH

BACKGROUND OF THE INVENTION

1. Field of the Invention

The present invention relates to the fabrication of silicon devices and more particularly to the growing of epitaxial layers of silicon by deposition at low temperatures.

2. Prior Art

Low temperature silicon epitaxial growth processes allow fabrication of novel and small silicon (Si) devices with structures important for high performance semiconductor applications, such as elevated source-drains for CMOS devices, and are key to producing some ultra-fast devices such as the heterojunction bipolar transistors (HBTs) in Si recently reported by G. L. PATTON, S. S. IYER, S. L. DELAGE, S. TIWARI, and J. M. C. STORK, in IEEE EDL, 9, 195 (1990). Important requirements for any potential epitaxial manufacturing process are adequate measures for defect avoidance and control, and broad utility, such as the capability of producing Si layers with necessary additives such as n- and p-type dopants and Ge. Two known low temperature epitaxial processes for Si are disclosed by B. S. MEYERSON in Appl. Phys. Lett., 48, 797 (1986), and T. O. SEDGWICK, M. BERKINBLIT, and T. S. KUAN in Appl. Phys. Lett., 54, 2689 (1989), the former using ultra-high vacuum, chemical-vapor deposition (UHV/CVD) with silane as a reactant, and the latter employing ultra-clean, atmospheric pressure, chemical-vapor deposition (APCVD) using dichlorosilane (DCS) as a reactant. (Here "ultra-clean" means that water vapor, oxygen and other oxidants have been carefully and systematically excluded from the reaction chamber and the gas handling system.) Other systems of this nature are generally disclosed in U.S. Pat. No. 4,592,792 to CORBOY, JR. ET AL and U.S. Pat. No. 4,786,615 to LIAW ET AL. While each of these systems have specific fabrication advantages, they also have definite limitations.

Problem

A common requirement for both of these low temperature epitaxial processes is a preclean step before epitaxial growth is begun in order to have the surface of the semiconductor substrate, typically a Si wafer surface, free of foreign material and oxide. In practice one or more preclean procedures are used with the goal of removing the foreign materials or at least rendering such materials relatively harmless to the subsequent fabrication process and the devices produced thereby. The best accepted standard preclean has been a $H_2$ prebake for several minutes at 950°–1190° C., with the lower temperatures being used for patterned wafers and the higher for non-patterned wafers. At the highest temperatures, $SiO_2$ reacts with Si to form the volatile oxide SiO, while at lower temperatures the $H_2$ is known to preferentially attack the bonding of the $SiO_2$ to the Si surface and hence undercut and presumably remove it. (See S. T. LIU, L. CHAU, and J. O. BOLAND, Proceedings of the Conference on Chemical Vapor Deposition, CVD-X, Eds. G. W. CULLEN, 87-8, The Electrochemical Society, Pennington, N.J., 1987, p. 428–434.) Also, lower temperature precleans in $H_2$ at temperatures down to 800° C., although still useful for removing oxide, are slower and not as effective and may leave some oxide or expose the wafer to reoxidation from inadvertent residual oxygen, water vapor or other oxidants in the gas phase. Because of the nature of the currently used UHV/CVD equipment, i.e., large constant temperature furnace and exclusive low pressure operation, a $H_2$ prebake is only possible at a deposition temperature of about 500°–600° C. and is therefore totally ineffective. The APCVD process on the other hand easily incorporates a $H_2$ preclean because of the temperature flexibility, i.e., 500°–1200° C., and the capability of flowing $H_2$ at one atmosphere pressure.

In carrying out the preclean step, when employing the UHV/CVD process, a liquid HF dip is used without a water rinse, which works well for a blanket Si wafer since the etch is hydrophobic and rolls off the surface. However, for a patterned wafer the etch droplets are difficult to remove and tend to hide in corners and edges of the oxide pattern to which they adhere because the oxide surface is hydrophilic; then, when the etch droplets are removed by being blown off, they scatter and ultimately evaporate leaving undesired etch by-products and particles on the Si surface. Nevertheless, as noted above, Si epitaxy grown by UHV/CVD uses deposition from silane gas. This deposition tends to overgrow some surface oxide and foreign material without causing a defect in the bulk of the film. But, although this overgrowth capability can greatly reduce, it does not totally eliminate, defects in the grown film due to foreign material at the surface. It will be understood that a film essentially free of defects is clearly necessary for high device yield. However, while it is undesirable to have encapsulated foreign material at the interface, it is not yet clear whether it can be a yield detractor.

In contrast to the UHV/CVD produced low defect film, the APCVD process using DCS can lead to a high density of random defects in the epi layer unless a high temperature prebake in $H_2$, e.g., at about 950° C. for about 5 minutes, is used just prior to deposition. Transmission electron microscope (TEM) data shows that foreign material and oxide at the interface leads to micro twin formation, a shallow surface pyramid and a relatively greater defect density than in the silane system. This is a disadvantage of the APCVD process with DCS.

A comprehensive epitaxial deposition system can dope high, controllable n- and p-type layers as well as produce SiGe alloys. Both UHV/CVD using silane and APCVD using DCS can grow such p-type layers as well as SiGe alloys. However, while n-type doping at very high levels is accessible in APCVD using DCS (See T. O. SEDGWICK, P. D. AGNELLO, D. NGUYEN NGOC, T. S. KUAN, and G. SCILLA, Appl. Phys. Lett., 58 (17) 1986 (1991)), high and controllable n-type doping in Si is not possible in silane-based systems at any temperature or pressure.

Another very important difference between the two low temperature epitaxial systems is that the APCVD process using DCS (with or without added HCl) grows Si selectively, a one-sided advantage. The UHV/CVD process using silane is not strongly selective. In the UHV/CVD silane system, while initially the Si deposits selectively, i.e., only on the bare Si leaving the oxide covered regions free of deposition, after the film has grown to a thickness of only 10 nm or so the deposition then takes place uniformly over both the oxide pattern as well as on the Si areas, that is, by blanket deposition.

The substitution of disilane for silane increases the selectivity thickness somewhat (See H. HIRAYAMA, T. TATSUMI, and N. AIZAKI, Appl. Phys. Lett., 52 (26) 2242 (1988)). Therefore, except for very thin layers, UHV/CVD is a blanket deposition process. The capability for both blanket and selective deposition is important and a powerful process would be able to grow either selective or blanket layers.

A further problem is raised by the present discovery that in the APCVD system silane will not react to deposit Si at low temperatures, about 750° C., in a pure $H_2$ ambience at one atmosphere pressure, since $H_2$ inhibits the decomposition of silane at low temperatures. Such deposition does take place in inert ambiences, but it appears that even though Si films may be grown in an ultra-clean system there is usually residual oxygen at the epitaxial interface, due to residual impurities of oxygen and water vapor in the high purity gas. This residual oxygen can react with the Si surface. In this regard it has been noted that intrinsic to the APCVD processing is the fact that $H_2$ has been found to inhibit the oxidation of a Si surface in the temperature range of 650°–850° C. (See T. O. SEDGWICK and P. D. AGNELLO, Proceedings of the Eleventh International Conference on Chemical Vapor Deposition, CVD-XI, Eds. K. E. SPEAR and G. W. CULLEN, 90-12, The Electrochemical Society, Pennington, N.J., 1990, Part IV, No. 33, p. 247-253.) Thus, while hydrogen inhibits the formation of oxide on the Si surface, a desirable effect, still too much hydrogen can prevent the silane decomposition, an undesirable effect, leading to conflicting processing requirements.

OBJECTS

It is accordingly an object of the present invention to provide a powerful process and system capable of growing either selective or blanket layers of epitaxial silicon in connection with APCVD processing to produce defect free films.

It is a further object of this invention to provide novel implementations of various process conditions to effect a comprehensive and broadly useful integrated low temperature epitaxial process.

It is also an object of this invention to optimally combine the advantages of a high temperature hydrogen prebake with the advantage of blanket deposition of Si from silane.

SUMMARY OF THE INVENTION

In accordance with the present invention, it has been discovered that in growing selective epitaxial layers of Si by deposition at low temperatures using the APCVD process there is a difference in defect density in the bulk of the film to be achieved as between the use of silane and dichlorosilane (DCS). Unexpectedly, Si deposited from silane appears to be able to overgrow interfacial oxide almost perfectly with few defects generated, while, also unexpectedly, Si deposited from DCS appears to grow with a significantly higher defect production on such surfaces.

Drawing on this discovery, the present invention, in order to reduce the defect density (due to, e.g., dislocations, twins and stacking faults) in either selective epitaxial layers of Si, or blanket layers of Si, on imperfectly cleaned Si surfaces, provides an APCVD system and method wherein 1) a first thin, e.g., 10 nm, layer of Si is grown on the surface from silane or disilane, followed by 2) the growing of the remainder of the film from DCS at the same low temperature, e.g., 550° C. to 850° C. The subsequent growth of the second layer with DCS over the first layer, especially if carried out immediately in the very same deposition system, will not introduce additional defects.

When performing selective epitaxy (SD) the first step uses silane or disilane to grow only the first several nanometers of Si such that the deposit remains selective. This deposition is then followed by subsequent growth from DCS, the second step, which is normally selective, so that the overall deposition process retains the advantage of being selective. This two step technique may also be used with blanket deposition (BD) of films in that the first step, the growth from silane or disilane, may be carried out to a greater thickness, e.g., 50 nm, or until the wafer surface including oxide areas, if present, are totally covered with Si. Subsequent growth may then be carried out with DCS as before but can be blanket growth because all of the oxide is covered with Si in the first step. In any event, in either the selective (SD) mode or blanket (BD) mode, the second step is carried out in DCS which allows high and controlled n-type doping which is not available in the silane-based system.

It has also been discovered that in the APCVD system silane will not react to deposit Si at 750° C. in a pure $H_2$ ambience at one atmosphere pressure, since $H_2$ inhibits the decomposition of silane at low temperatures. However, deposition does take place in inert ambiences, e.g., Argon, Nitrogen, and Helium, and in mixtures of $H_2$ and inert gas at low temperature. Helium is the preferred inert gas in this environment. Further, it has also been noted that intrinsic to the above processing is the fact that $H_2$ has been found to inhibit the oxidation of a Si surface in the temperature range of 650°–850° C. Consequently, in order to achieve an optimal trade-off between the need for an helium ambience to promote silane reaction at low temperature and the need for a hydrogen ambience to prevent surface oxidation from inadvertant residual impurities, depositions are carried out in an ambience composed primarily of He but always containing some $H_2$. This tradeoff is rendered effective in part because there is an incubation time for the oxidation but no incubation time for the silane reaction.

A further feature of the present invention involves, instead of using He for $H_2$ as the primary carrier gas when depositing Si from silane at low temperatures, alternatively dichlorosilane (DCS) with a diborane additive may be used instead of silane in the normal hydrogen carrier. This modification, permits DCS to be used in atmospheric pressure processes for Si deposition at low temperatures, which conventionally deposit Si selectively, to deposit blanket (non-selective) Si films over insulator and Si areas, and particularly such areas on a patterned wafer. Because the Si deposition rate is enhanced when diborane is added, significant non-selective deposition rates can occur down to 550° C.

DETAILED DESCRIPTION OF THE PREFERRED EMBODIMENTS

The present invention involves the fabrication of silicon devices, such as HBTs, and particularly an improved process and system for the growing of thin epitaxial layers of silicon on a semiconductor, typically silicon, surface by deposition at low temperatures. In one embodiment, the process essentially comprises two general steps, the first using silane or disilane to grow only the first several nanometers of Si, such that the deposit remains selective, and the second using subsequent growth from DCS. The latter growth is normally selective, so that the overall deposition process retains the advantage of being selective. However, this two step technique while advantageous with selective epitaxy (SD) may also be used for blanket deposition (BD) of films by carrying out the growth from silane or disilane in the first step to a greater thickness, e.g., 50 nm, or until the wafer surface including oxide areas, if present, are totally covered with Si, and then carrying out the subsequent growth with DCS as blanket growth since all of the oxide is covered with Si in the first step. More particularly, a preferred method of growth with this embodiment may be carried out under certain general conditions and consists of the following steps:

1) To begin with, all depositions are performed in an ultra-clean deposition system where water vapor, oxygen and other oxidants are rigorously avoided. An ambience of $H_2$ and the highest pressure available (up to one atmosphere) is used during initial heat up and in between process steps. The time at temperature is minimized to avoid inadvertant surface oxidation from residual oxidizing impurities.

2) It is desirable to heat and prebake the wafer in $H_2$ where the device application allows it. The typical prebake may be at a temperature of between about 800° C. and 1000° C. for a period of about 1-10 minutes, and preferably at about 900° to 950° C. for about 5 minutes.

3) The sample is cooled to the deposition temperature, in the range from about 550° to 850° C. in hydrogen, and the silane flow is started even though initially no deposition will take place in the $H_2$ ambience. Along with the starting of silane flow, helium flow is begun and the $H_2$ flow is turned down to a lower level. The helium fraction of the total gas may be be in the range of 20-95% and typically will be in the range of at least 50%, and preferably from about 80 to about 95%. The lower the temperature, the higher the helium concentration must be to promote reaction. The silane concentration may be in the range of about 100-5,000 ppm or more of the total gas, but this concentration has been found to not be critical to achieving satisfactory results.

4) When the desired Si thickness from the silane reaction is achieved, the first general step is completed and the silane and helium are turned off; then, the carrier gas is shifted to $H_2$ and the DCS flow is started, with or without added dopant, and the desired layer thickness is grown.

This preferred method was implemented in an actual experiment which was carried out using the following process conditions and parameters.

EXAMPLE 1

Experimentally, a Si film was grown from silane on an imperfectly cleaned Si surface with an interfacial oxygen density (the usual major impurity) after growth of 1 times 10E15/cm2. It was found that this film had a defect density of 3.3 times 10E2/cm2 as determined by Secco etching. The film was grown at 750° C. to a thickness of 240 nm using 1,000 ppm silane and 5% hydrogen and 95% helium.

A comparable deposit made from DCS on a Si surface intentionally dosed with oxygen to 3.2 times 10E14/cm2 had in contrast a huge pyramidal (twins) defect density of 2.2 times 10E7/cm2. This film was grown from 1,000 ppm DCS at 750° C. in $H_2$. The oxygen dosing was carried out at 750° C. before growing epitaxy by exposing the Si surface to 25 ppb oxygen in hydrogen for 12 minutes. Although the oxygen density in the sample grown from silane was 3 times that in the sample grown from DCS, the defect density was about five orders of magnitude less in the silane sample. Thus it appears that the use of a two step deposition process as described above should lead to a substantial reduction in defects due to residual oxide and foreign material on a Si substrate surface.

It is also important to note that this two step process with DCS as the reactant in the second step, allows n-type doping in that step, which is normally unavailable when using a silane-based system. Consequently, such doping can be done during or at the end of the Si deposition from DCS, as desired, in the APCVD system using silane deposition.

On the other hand, the second step of this process using DCS cannot be carried out in a UHV/CVD system because chlorine compounds are considered too corrosive for the pumping system and because of by-product chlorine containing polymers whose out-gassing prevents pump down to achieve the required low pressure. However, the two steps of the process could be implemented in any low pressure system where pump corrosion was not considered a problem, by-product out-gassing did not interfere with attaining the required low pressure, and where the system was sufficiently free of oxygen, water vapor and other oxidants that they did not prevent high quality epitaxial growth at low temperatures.

In fully understanding the factors and parameters involved in implementing the invention, it should be appreciated that there is a significant advantage in using silane as a reactant in CVD epitaxial/polycrystalline systems since silane deposition, while initially selective, upon reaching a sufficient film thickness, leads to blanket deposition over both bare Si and oxide, a considerable improvement in some device fabrication schemes. At the same time, as noted above, a hydrogen prebake at 800°-1000° C. is a well established and currently the most effective method of cleaning a Si surface preceding epitaxial growth. Such a high temperature prebake is not currently possible in the UHV/CVD tools but is readily available in commercially available APCVD tools such as the ASM reactor.

Studies have shown that the exposure of a Si surface to the most pure hydrogen gas currently available in an ultra-clean system, i.e. about 5-8 ppb oxygen (and perhaps roughly the same amount of water vapor) still leads to some oxidation of the surface below 750° C. after a period of minutes. However, it has also been determined that an atmosphere of hydrogen creates an incubation time (of the order of minutes) before oxidation starts. At the same time, silane is believed to react immediately upon reaching the substrate surface since there is no current information suggesting an incubation period for growth on single crystal Si.

Importantly, it has been discovered that in the APCVD system silane will not react to deposit Si at low temperatures, 550°-850° C., typically 750° C., in a pure $H_2$ ambience at one atmosphere pressure, since $H_2$ inhibits the decomposition of silane at low temperatures. However, deposition does take place in inert ambiences, such as of Argon, Nitrogen, and Helium, and in mixtures of $H_2$ and an inert gas at low temperature. Helium is the preferred inert gas in this environment since the gas flow tends to be laminar leading to deposition only on the wafer surface, while Argon can lead to convection cell formation, homogeneous gas phase nucleation and possible undersirable particulate formation. The inert gas content of the gas ambience may range anywhere from 20% to 95% or more, but typically, it will constitute at least about 50%, and usually in the range of about 80% to 95%, depending upon the operating temperature.

It is also an important fact, intrinsic to the present APCVD processing, that $H_2$ inhibits the oxidation of a Si surface in the temperature range of 550°–850° C. It appears that even though Si films are grown in an ultra-clean system there is usually residual oxygen at the epitaxial interface that is due to residual impurities of oxygen and water vapor in the high purity gas which can react with the Si in the absence of hydrogen. Accordingly, it is known that hydrogen inhibits the formation of oxide on the Si surface, a desirable effect, but it is also clear, as noted above, that too much hydrogen can prevent the silane decomposition, leading to conflicting processing requirements. Based on these facts, the invention contemplates that an optimal trade-off should be sought between the need for a helium ambience to promote silane reaction at low temperature and the need for a hydrogen ambience to prevent surface oxidation from inadvertant residual impurities, and optimally combining the advantages of a high temperature hydrogen prebake with the advantage of blanket deposition of Si from silane.

Consequently, it is a feature of the present invention that when carrying out the foregoing process, a) that hydrogen should be present in the reactant gas at all times before silane reaction, i.e., 1) during the initial heat up of the wafer to the prebake temperature, 2) during the hydrogen prebake, 3) during the cool-down to silane reaction temperature, 4) during the start-up of the silane flow over the substrate and 5) even during the silane reaction albeit at a low level. In addition, b) the time for the last three steps should be reasonably minimized (to no more than a few minutes) since oxide removal does not effectively take place at low temperatures but oxidation can take place after an initial incubation period. The invention thus contemplates maximizing the exposure of the wafer to an ambience containing hydrogen which, unfortunately, inevitably contains residual oxygen and water vapor impurities. However, because the oxidation effect has an incubation period and the silane deposition does not, the minimization of the time at low temperature should avoid reoxidation from the background impurities.

Alternatively, disilane can be used, instead of silane, as the silicon source gas in the process and may have the advantage of reacting at a lower temperature. Thus, a silane without the presence of chlorine or other halogens will be suitable in this situation.

A particular method for carrying out this feature of the present invention essentially involves the following sequence of steps.

1) Immediately after loading the wafer, having the semiconductor receiving surface typically of Si, into the reactor the ambience is changed to hydrogen.
2) The Si substrate is prebaked in hydrogen for about 1–10 minutes, and preferably about 5 minutes, at an appropriate temperature in the range between 800° C. to 1000° C., and preferably about 900° to 950° C.

It should be noted that the Si substrate may be patterned having both bare Si and oxide or nitride areas exposed. The higher temperature gets rid of surface oxygen faster but may also etch the oxide patterns or the high temperature may cause undesirable dopant diffusion or other reactions in a particular partially-fabricated device structure.

3) The substrate is cooled to the deposition temperature for silane, from 550° C. to 850° C., and typically 750° C., in hydrogen.
4) The silane flow is started and briefly no deposition will take place in the hydrogen ambience.
5) The flow of He is also started and quickly deposition begins.
6) The flow of hydrogen is turned down to a low level and maintained at that level for the duration of the Si deposition.

It should be understood in adjusting the hydrogen level that some hydrogen is always present as a decomposition product of Si growth from silane. Also, it has been found that the presence of some hydrogen, such as that used as dilutent in the source gas cylinder, i.e. 10% silane in 90% hydrogen, does not substantially alter the utility of the process of the invention. The time duration of steps (3)–(6) should be minimized while still assuring that the silane has flowed for sufficient time to have achieved a steady state concentration profile over the Si surface. As noted above, the inert gas content of the gas ambience may range anywhere from 20% to 95% or more, but typically, it will constitute at least about 50%, and usually in the range of about 80% to 95%, depending upon the operating temperature. Also, disilane may be used as an alternative to silane.

A further feature of the present invention consists of, instead of using He as the primary carrier gas when depositing Si from silane at low temperatures, alternatively adding diborane to dichlorosilane (DCS) and using this gas as the silicon source gas in the normal hydrogen carrier. This modification will also make the Si deposition non-selective at low temperatures where a boron doping to about $1-10 \times 10^{19}$ cm$^{-3}$ or more is desirable or at least not objectionable. Thus, atmospheric pressure processes for Si deposition at low temperatures which conventionally deposit Si selectively can be modified to deposit blanket (non-selective) Si films over insulator and Si areas, and particularly such areas on a patterned wafer. Because the Si deposition rate is enhanced when diborane is added, significant non-selective deposition rates occur down to 550° C.

It will accordingly be seen that processes directed to building VLSI and ULSI circuits in Si, including but not restricted to high performance bipolar and CMOS circuits, may utilize blanket films of Si in the fabrication of devices. In the absence of this invention ultra-clean APCVD at low temperatures cannot deposit blanket Si films over both insulator and Si areas. In general, the high growth rate and low temperature of the APCVD process enables deposition of epitaxial Si without significant high temperature thermal cycles which can redistribute dopant impurities in structures. In contrast to other low temperature processes such as UHV/CVD, the APCVD process is performed at atmospheric pressure, resulting in process apparatus which is simpler, more reliable and less expensive. It is contemplated, within the scope of the invention, that germanium might be added to the silicon surface and/or deposition without significantly changing the results of the basic process.

What is claimed is:

1. A method for minimizing defect density in growing epitaxial films of Si by deposition at low temperatures on a receiving surface at atmospheric pressure, comprising the steps of:

first growing a layer of Si on said receiving surface from silane or disilane at a low temperature in the range from about 550° C. to about 850° C.;

followed by the growing of the remainder of the Si film from dichlorosilane at a low temperature substantially in the same temperature range.

2. A method as in claim 1 wherein said low temperature is about 750° C.

3. A method as in claim 1 wherein said Si layer from silane is grown to a thickness such that the deposition is entirely selective and said growing from dichlorosilane continues selective.

4. A method as in claim 1 wherein said Si layer from silane is grown to a sufficient thickness such that said growing from dichlorosilane is in the form of blanket deposition.

5. A method as in claim 1 further comprising, after said first step, the step of n-type doping said film.

6. A method as in claim 1 wherein said first step is carried out in an hydrogen and inert gas ambience.

7. A method as in claim 6 wherein said inert gas is helium.

8. A method as in claim 6 wherein said ambience comprises at least 50% inert gas.

9. A method as in claim 1 wherein said receiving surface comprises the surface of a patterned wafer.

10. A method for growing epitaxial films of Si with p-type doping by deposition at low temperatures on a receiving surface at atmospheric pressure, comprising the steps of:

providing an ambience of hydrogen, dichlorosilane, and diborane for said receiving surface;

growing a layer of Si from said dichlorosilane on said receeiving surface at a temperature in the range from about 550° C. to about 850° C.; and introducing an p-type dopant into said ambience to dope said layer.

11. A method for minimizing defect density in growing epitaxial films of Si by deposition at low temperatures on a receiving surface at atmospheric pressure, comprising the steps of:

producing a flow of hydrogen to create a hydrogen ambience for the receiving surface on which deposition is to take place;

prebaking the receiving surface in the hydrogen ambience for a time in the range of about 1 to about 10 minutes at a temperature in the range between about about 800° C. and about 1000° C.;

cooling the receiving surface to the deposition temperature for silane, in the range from about 550° C. to about 850° C.;

providing a flow of an inert gas to produce an inert ambience for said prebaked receiving surface;

providing a flow of silane in said ambience to produce Si deposition from said silane; and reducing the flow of hydrogen to reduce the presence of hydrogen in the ambience to a low level for the duration of the Si deposition.

12. A method as in claim 11 further comprising the steps of:

turning off the flows of said silane and said inert gas and turning up the flow of hydrogen to provide an hydrogen ambience; and providing a flow of dichlorosilane into said hydrogen ambience at the the receiving surface deposition temperature for silane, to produce Si deposition on the deposition from said silane.

13. A method as in claim 12 further comprising the step of n-type doping said deposition from said dichlorosilane.

14. A method as in claim 12 wherein said inert gas constitutes at least about 50%, and preferably in the range of about 80% to 95% of the total ambience during Si deposition from silane.

* * * * *